(12) United States Patent
Nishijima et al.

(10) Patent No.: US 9,752,032 B2
(45) Date of Patent: Sep. 5, 2017

(54) CURABLE SILICONE COMPOSITION, CURED PRODUCT THEREOF, AND OPTICAL SEMICONDUCTOR DEVICE

(71) Applicant: Dow Corning Toray Co., Ltd., Tokyo (JP)

(72) Inventors: Kazuhiro Nishijima, Ichihara (JP); Takashi Sagawa, Ichihara (JP); Tomohiro Iimura, Ichihara (JP); Michitaka Suto, Ichihara (JP); Kasumi Takeuchi, Ichihara (JP); Haruhiko Furukawa, Ichihara (JP); Yoshitsugu Morita, Ichihara (JP)

(73) Assignee: DOW CORNING TORAY CO., LTD., Tokyo (JP)

( * ) Notice: Subject to any disclaimer, the term of this patent is extended or adjusted under 35 U.S.C. 154(b) by 0 days.

(21) Appl. No.: 14/655,581

(22) PCT Filed: Dec. 24, 2013

(86) PCT No.: PCT/JP2013/085314
§ 371 (c)(1),
(2) Date: Jun. 25, 2015

(87) PCT Pub. No.: WO2014/104389
PCT Pub. Date: Jul. 3, 2014

(65) Prior Publication Data
US 2015/0344692 A1     Dec. 3, 2015

(30) Foreign Application Priority Data
Dec. 28, 2012  (JP) .................................. 2012-288122

(51) Int. Cl.
*C08G 77/08*   (2006.01)
*C08L 83/04*   (2006.01)
*C08G 77/14*   (2006.01)
*C08L 83/06*   (2006.01)
*H01L 33/56*   (2010.01)
*H01L 23/00*   (2006.01)

(52) U.S. Cl.
CPC .............. *C08L 83/04* (2013.01); *C08G 77/14* (2013.01); *C08L 83/06* (2013.01); *H01L 33/56* (2013.01); *H01L 24/73* (2013.01); *H01L 2224/32245* (2013.01); *H01L 2224/48247* (2013.01); *H01L 2224/73265* (2013.01)

(58) Field of Classification Search
CPC .................................. C08L 83/04; C08L 83/06
See application file for complete search history.

(56) References Cited

U.S. PATENT DOCUMENTS

| | | | |
|---|---|---|---|
| 7,863,392 B2 * | 1/2011 | Nakanishi ............... | C08L 83/04 523/107 |
| 8,258,502 B2 * | 9/2012 | Yoshitake ............ | C08K 5/5425 257/40 |
| 8,614,282 B2 | 12/2013 | Hamamoto et al. | |
| 2005/0061437 A1 | 3/2005 | Goto et al. | |
| 2007/0112147 A1 * | 5/2007 | Morita .................... | C08L 83/04 525/478 |
| 2010/0224906 A1 * | 9/2010 | Kashiwagi .............. | C08L 83/04 257/100 |
| 2011/0227235 A1 * | 9/2011 | Yoshitake ............... | C08L 83/04 257/791 |
| 2012/0056236 A1 | 3/2012 | Hamamoto et al. | |
| 2013/0009201 A1 * | 1/2013 | Ko .......................... | C08L 83/04 257/100 |
| 2013/0161683 A1 | 6/2013 | Hamamoto et al. | |
| 2013/0296514 A1 | 11/2013 | Choi et al. | |
| 2014/0031509 A1 | 1/2014 | Ko et al. | |

FOREIGN PATENT DOCUMENTS

| | | |
|---|---|---|
| EP | 1 424 363 A1 | 6/2004 |
| JP | 2012-052035 A | 3/2012 |
| JP | 2012-052045 A | 3/2012 |
| WO | WO 2007/001039 A1 | 1/2007 |
| WO | WO 2007/100445 A2 | 9/2007 |
| WO | WO 2009/154260 A1 | 12/2009 |
| WO | WO 2011/090364 A2 | 7/2011 |
| WO | WO 2011/090364 A2 | 7/2012 |

(Continued)

OTHER PUBLICATIONS

English language abstract for WO 2011/090364 extracted from espacenet.com, database on Feb. 22, 2016, 1 page.
English language abstract for WO 2012/093907 extracted from espacenet.com database on Feb. 22, 2016, 1 page.
Stern, S.A. et al., "Structure-Permeability Relationships in Silicone Polymers", Journal of Polymer Science: Part B: Polymer Physics, vol. 25, 1987, pp. 1263-1298.
International Search Report for Application No. PCT/JP2013/085313 dated Jul. 3, 2014, 3 pages.
International Search Report for Application No. PCT/JP2013/085314 dated Jul. 7, 2014, 4 pages.
International Search Report for Application No. PCT/JP2013/085315 dated Jul. 7, 2014, 3 pages.

(Continued)

*Primary Examiner* — Margaret Moore
(74) *Attorney, Agent, or Firm* — Howard & Howard Attorneys PLLC

(57) ABSTRACT

The present invention relates to a curable silicone composition comprising: (A) an organopolysiloxane resin having at least two alkenyl groups in a molecule; (B) an organopolysiloxane represented by a general formula; (C) an organosiloxane ($C_1$) having silicon-bonded hydrogen atoms at both molecular terminals, an organopolysiloxane ($C_2$) having at least two silicon-bonded hydrogen atoms in a molecule, or a mixture of components ($C_1$) and ($C_2$); and (D) a hydrosilylation reaction catalyst. The curable silicone composition has excellent handleability and can form a cured product with a high refractive index and low gas permeability when cured.

20 Claims, 1 Drawing Sheet

(56) References Cited

FOREIGN PATENT DOCUMENTS

| WO | WO 2014/104388 A2 | 7/2014 |
| WO | WO 2014/104390 A2 | 7/2014 |

OTHER PUBLICATIONS

English language abstract and machine-assisted English translation for JP 2012-052035 extracted from espacenet.com database on Jul. 6, 2015, 27 pages.

English language abstract for JP 2012-052045 extracted from espacenet.com database on Jul. 8, 2015, 2 pages.

\* cited by examiner

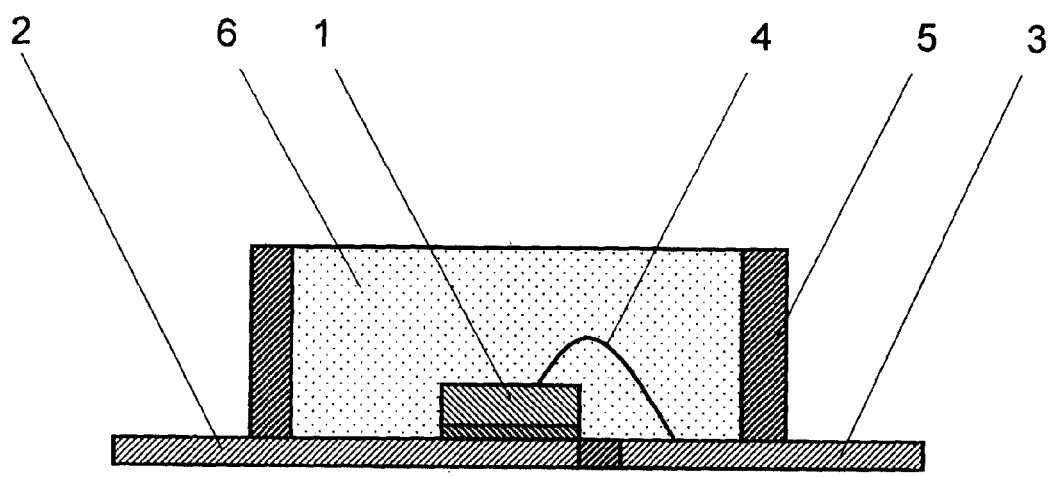

CURABLE SILICONE COMPOSITION, CURED PRODUCT THEREOF, AND OPTICAL SEMICONDUCTOR DEVICE

CROSS-REFERENCE TO RELATED APPLICATIONS

This application is the National Stage of International Patent Application No. PCT/JP2013/085314, filed on Dec. 24, 2013, which claims priority to and all the advantages of Japanese Patent Application No. 2012-288122, filed on Dec. 28, 2012, the content of which is incorporated herein by reference.

TECHNICAL FIELD

The present invention relates to a curable silicone composition, a cured product formed by curing the composition, and an optical semiconductor device produced using the composition.

BACKGROUND ART

Curable silicone compositions are used as sealing materials or protective coating materials for optical semiconductor elements in optical semiconductor devices such as light emitting diodes (LEDs). Because cured products of curable silicone compositions typically exhibit high gas permeability, when such cured products are used in high brightness LEDs, which exhibit high light intensity and generate large amounts of heat, problems occur such as discoloration of the sealing material due to corrosive gases and a reduction in brightness due to corrosion of silver plated on the LED substrate.

In order to solve such problems, Japanese Unexamined Patent Application Publication No. 2012-052035A proposes a curable silicone composition comprising a diorganopolysiloxane which is capped at both molecular terminals with alkenyl groups, has a short main skeleton, has no adjacent diphenylsiloxane units, and has a methyl group in the center, an organohydrogenpolysiloxane, and a hydrosilylation reaction catalyst.

However, in the composition described above, it is difficult to ensure that no diphenylsiloxane units are adjacent to one another and to prepare a diorganopolysiloxane having a methyl group in the center. In addition, when the content of diphenylsiloxane units exceeds the content of other diorganosiloxane units, the viscosity of the curable silicone composition increases, which diminishes handleability, and there is also the problem that the mechanical characteristics of a cured product obtained by curing the composition are reduced.

An object of the present invention is to provide a curable silicone composition having excellent handleability and forming a cured product with a high refractive index and low gas permeability when cured. In addition, another object of the present invention is to provide a cured product having a high refractive index and a low gas permeability and to provide an optical semiconductor device having excellent reliability.

DISCLOSURE OF INVENTION

The curable silicone composition of the present invention comprises:
(A) 100 parts by mass of an organopolysiloxane resin having at least two alkenyl groups in a molecule and represented by the average unit formula:

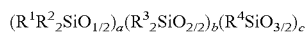

wherein $R^1$ is an alkenyl group having from 2 to 12 carbons; $R^2$ are the same or different, and are each an alkyl group having from 1 to 12 carbons, an alkenyl group having from 2 to 12 carbons, an aryl group having from 6 to 20 carbons, or an aralkyl group having from 7 to 20 carbons; $R^3$ are the same or different, and are each an alkyl group having from 1 to 12 carbons, an alkenyl group having from 2 to 12 carbons, or a phenyl group; $R^4$ is an aryl group having from 6 to 20 carbons or an aralkyl group having from 7 to 20 carbons; and a, b, and c are numbers that satisfy such that $0.01 \leq a \leq 0.5$, $0 \leq b \leq 0.7$, $0.1 \leq c < 0.9$, and $a+b+c=1$;

(B) from 5 to 150 parts by mass of an organopolysiloxane represented by the general formula:

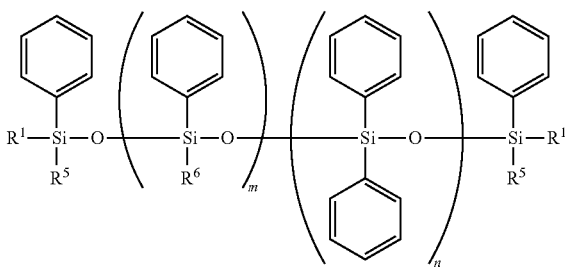

wherein $R^1$ is synonymous with that described above; $R^5$ are the same or different, and are each an alkyl group having from 1 to 12 carbon atoms or a phenyl group; $R^6$ is an alkyl group having from 1 to 12 carbon atoms; and m is an integer from 1 to 100, n is an integer from 0 to 50, where $m \geq n$ and $1 \leq m+n \leq 100$;

(C) an organosiloxane ($C_1$) represented by the general formula:

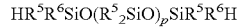

$HR^5R^6SiO(R^5_2SiO)_pSiR^5R^6H$ wherein $R^5$ and $R^6$ are synonymous with those above; and p is an integer from 0 to 100;

an organopolysiloxane ($C_2$) having at least two silicon-bonded hydrogen atoms in a molecule and represented by the average unit formula:

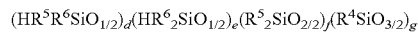

$(HR^5R^6SiO_{1/2})_d(HR^6_2SiO_{1/2})_e(R^5_2SiO_{2/2})_f(R^4SiO_{3/2})_g$ wherein $R^4$, $R^5$, and $R^6$ are synonymous with those described above; and d, e, f, and g are numbers that satisfy such that $0.01 \leq d \leq 0.7$, $0 \leq e \leq 0.5$, $0 \leq f \leq 0.7$, $0.1 \leq g < 0.9$, and $d+e+f+g=1$; or a mixture of components ($C_1$) and ($C_2$), in an amount such that the number of silicon-bonded hydrogen atoms in the present component is from 0.1 to 5 moles per 1 mol of total alkenyl groups in components (A) and (B); and (D) an effective amount of a hydrosilylation reaction catalyst.

The cured product of the present invention is formed by curing the aforementioned curable silicone composition.

The optical semiconductor device of the present invention is produced by sealing an optical semiconductor element with a cured product of the curable silicone composition described above.

Effects of Invention

The curable silicone composition of the present invention has excellent handleability and forms a cured product with a high refractive index and low gas permeability when cured. Furthermore, the cured product of the present invention is characterized by having a high refractive index and a low gas permeability, and the optical semiconductor device of the present invention is characterized by exhibiting excellent reliability.

BRIEF DESCRIPTION OF THE DRAWINGS

FIG. 1 is a cross-sectional view of an LED that is an example of the optical semiconductor device of the present invention.

DETAILED DESCRIPTION OF THE INVENTION

First, the curable silicone composition of the present invention will be described in detail.

Component (A) is a base compound of this composition and is an organopolysiloxane resin represented by the average unit formula:

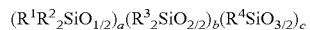

$(R^1R^2{}_2SiO_{1/2})_a(R^3{}_2SiO_{2/2})_b(R^4SiO_{3/2})_c$ and having at least two alkenyl groups in a molecule.

In the formula, $R^1$ is an alkenyl group having from 2 to 12 carbons, examples of which include vinyl groups, allyl groups, butenyl groups, pentenyl groups, hexenyl groups, heptenyl groups, octenyl groups, nonenyl groups, decenyl groups, undecenyl groups, and dodecenyl groups, and a vinyl group is preferable.

In the formula, $R^2$ are the same or different, and are each an alkyl group having from 1 to 12 carbons, an alkenyl group having from 2 to 12 carbons, an aryl group having from 6 to 20 carbons, or an aralkyl group having from 7 to 20 carbons. Examples of the alkyl group of $R^2$ include methyl groups, ethyl groups, propyl groups, butyl groups, pentyl groups, hexyl groups, heptyl groups, octyl groups, nonyl groups, decyl groups, undecyl groups, and dodecyl groups, and a methyl group is preferable. Examples of the alkenyl group of $R^2$ include the same groups described for $R^1$. Of these, a vinyl group is preferable. Examples of the aryl groups of $R^2$ include phenyl groups, tolyl groups, xylyl groups, naphthyl groups, anthracenyl groups, phenanthryl groups, pyrenyl groups, and groups in which the hydrogen atoms of these aryl groups are substituted with alkyl groups such as methyl groups and ethyl groups; alkoxy groups such as methoxy groups and ethoxy groups; or halogen atoms such as chlorine atoms and bromine atoms. Of these, phenyl groups and naphthyl groups are preferable. Examples of the aralkyl groups of $R^2$ include benzyl groups, phenethyl groups, naphthyl ethyl groups, naphthyl propyl groups, anthracenyl ethyl groups, phenanthryl ethyl groups, pyrenyl ethyl groups, and groups in which the hydrogen atoms of these aralkyl groups are substituted with alkyl groups such as methyl groups and ethyl groups; alkoxy groups such as methoxy groups and ethoxy groups; or halogen atoms such as chlorine atoms and bromine atoms.

In the formula, $R^3$ are the same or different, and are alkyl groups having from 1 to 12 carbons, alkenyl groups having from 2 to 12 carbons, or phenyl groups. Examples of the alkyl group of $R^3$ include the same alkyl groups described for $R^2$, and the alkyl group is preferably a methyl group. Examples of the alkenyl group of $R^3$ include the same groups described for $R^1$. Of these, a vinyl group is preferable.

In the formula, $R^4$ is an aryl group having from 6 to 20 carbons or an aralkyl group having from 7 to 20 carbons. Examples of the aryl group of $R^4$ include the same aryl groups described for $R^2$, and the aryl group is preferably a phenyl group or naphthyl group. Examples of the aralkyl group of $R^4$ include the same aralkyl groups described for $R^2$.

In the formula, a, b, and c are respectively numbers satisfying $0.01 \le a \le 0.5$, $0 \le b \le 0.7$, $0.1 \le c < 0.9$, and $a+b+c=1$, preferably numbers satisfying $0.05 \le a \le 0.45$, $0 \le b \le 0.5$, $0.4 \le c < 0.85$, and $a+b+c=1$, and even more preferably numbers satisfying $0.05 \le a \le 0.4$, $0 \le b \le 0.4$, $0.45 \le c < 0.8$, and $a+b+c=1$. This is because the gas permeability of the cured product is reduced if a is not more than the lower limit of the above-mentioned range and stickiness hardly occurs in the cured product if a is not more than the upper limit of the above-mentioned range. This is also because the hardness of the cured product is favorable and the reliability improves when b is less than or equal to the upper limit of the range described above. This is also because the refractive index of the cured product is favorable when c is greater than or equal to the lower limit of the range described above, and the mechanical characteristics of the cured product improve when c is less than or equal to the upper limit of the range described above.

Component (A) is expressed by the average unit formula described above but may also have siloxane units represented by the formula: $R^7{}_3SiO_{1/2}$, siloxane units represented by the formula: $R^8SiO_{3/2}$, or siloxane units represented by the formula: $SiO_{4/2}$ within a range that does not diminish the object of the present invention. In the formula, $R^7$ are the same or different, and are each an alkyl group having from 1 to 12 carbon atoms, an aryl group having from 6 to 20 carbon atoms, or an aralkyl group having from 7 to 20 carbon atoms. Examples of the alkyl group of $R^7$ include the same alkyl groups described for $R^2$. Examples of the aryl group of $R^7$ include the same aryl groups described for $R^2$. Examples of the aralkyl group of $R^7$ include the same aralkyl groups described for $R^2$. In the formula, $R^8$ is an alkyl group having from 1 to 12 carbon atoms or an alkenyl group having from 2 to 12 carbon atoms. Examples of the alkyl group of $R^8$ include the same alkyl groups described for $R^2$. Examples of the alkenyl group of $R^8$ include the same groups described for $R^1$. Furthermore, component (A) may contain silicon-bonded alkoxy groups, such as methoxy groups, ethoxy groups, or propoxy groups, or silicon-bonded hydroxyl groups as long as the objective of the present invention is not impaired.

Component (B) is an organopolysiloxane represented by the general formula:

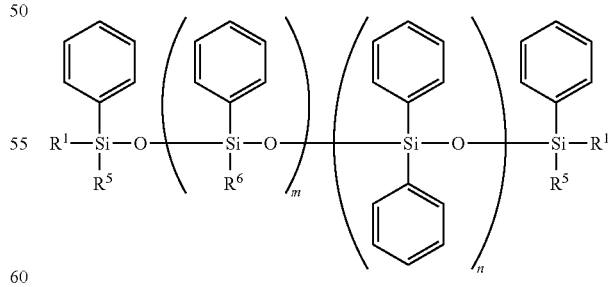

In the formula, $R^1$ are the same or different, and are alkenyl groups having from 2 to 12 carbon atoms, examples of which are the same groups as those described above, and vinyl groups are preferable.

In the formula, $R^5$ are the same or different, and are each an alkyl group having from 1 to 12 carbon atoms or a phenyl group. Examples of the alkyl group of $R^5$ include the same alkyl groups described for $R^2$, and the alkyl group is preferably a methyl group.

In the formula, $R^6$ is an alkyl group having from 1 to 12 carbons, and examples of the alkyl group having from 1 to 12 carbons of $R^6$ include the same alkyl groups as those of $R^2$ described above. Of those, methyl groups are preferable.

In the formula, m is an integer from 1 to 100 and n is an integer from 0 to 50, where m≥n and 1≤m+n≤100. Preferably, m is an integer from 1 to 75 and n is an integer from 0 to 25, where m≥n and 1≤m+n≤75, and more preferably, m is an integer from 1 to 50 and n is an integer from 0 to 25, where m≥n and 1≤m+n≤50. This is because when m is greater than or equal to the lower limit of the aforementioned range, the refractive index of the cured product becomes high, and when m is less than or equal to the upper limit of the aforementioned range, the handleability of the composition is good.

Component (B) is expressed by the general formula described above but may also have silicon-bonded alkoxy groups such as methoxy groups, ethoxy groups, or propoxy groups or silicon-bonded hydroxyl groups within a range that does not diminish the object of the present invention.

Examples of this type of component (B) include organopolysiloxanes such as those mentioned below. In the formula, Me, Vi, and Ph are respectively a methyl group, a vinyl group, and a phenyl group, m' is an integer from 1 to 100, and n' is an integer from 1 to 50, where m'≥n' and m'+n'≤100.

MePhViSiO(MePhSiO)$_{m'}$SiMePhVi

MePhViSiO(MePhSiO)$_{m'}$(Ph$_2$SiO)$_{n'}$SiMePhVi

Ph$_2$ViSiO(MePhSiO)$_{m'}$SiPh$_2$Vi

Ph$_2$ViSiO(MePhSiO)$_{m'}$(Ph$_2$SiO)$_{n'}$SiPh$_2$Vi

In the present composition, the content of component (B) relative to 100 parts by mass of component (A) is within the range of 5 to 150 parts by mass, and preferably is in the range of 10 to 100 parts by mass. This is because when the content of component (B) is less than or equal to the upper limit of the range described above, it is possible to impart the cured product with flexibility, and when the content is greater than or equal to the lower limit of the range described above, the mechanical properties of the cured product are favorable.

Component (C) is a crosslinking agent for the present composition, and is an organosiloxane (C$_1$) represented by general formula:

HR$^5$R$^6$SiO(R$^5{}_2$SiO)$_p$SiR$^5$R$^6$H;

an organopolysiloxane (C$_2$) represented by the average unit formula:

(HR$^5$R$^6$SiO$_{1/2}$)$_d$(HR$^6{}_2$SiO$_{1/2}$)$_e$(R$^5{}_2$SiO$_{2/2}$)$_f$(R$^4$SiO$_{3/2}$)$_g$;

or a mixture of components (C$_1$) and (C$_2$).

In component (C$_1$), $R^5$ are the same or different, and are each an alkyl group having from 1 to 12 carbons or a phenyl group. Examples of the alkyl group of $R^5$ include the same alkyl groups described for $R^2$, and the alkyl group is preferably a methyl group.

In the formula, $R^6$ are the same or different, and are each an alkyl group having from 1 to 12 carbons, examples of which include the same alkyl groups as described for $R^2$, and are preferably methyl groups.

In the formula, p is an integer from 0 to 100 and, in order for the composition to exhibit excellent handling/workability, is preferably an integer from 0 to 30, and more preferably an integer from 0 to 10.

Examples of this type of component (C$_1$) include organosiloxanes such as those mentioned below. Moreover, Me, Ph, and Naph in the formulae below denote a methyl group, a phenyl group, and a naphthyl group respectively, p' is an integer from 1 to 100, p" and p'" are each numbers of 1 or higher, and p"+p'" is an integer of 100 or lower.

HMe$_2$SiO(Ph$_2$SiO)$_{p'}$SiMe$_2$H

HMePhSiO(Ph$_2$SiO)$_{p'}$SiMePhH

HMeNaphSiO(Ph$_2$SiO)$_{p'}$SiMeNaphH

HMePhSiO(Ph$_2$SiO)$_{p''}$(MePh$_2$SiO)$_{p'''}$SiMePhH

HMePhSiO(Ph$_2$SiO)$_{p''}$(Me$_2$SiO)$_{p'''}$SiMePhH

In component (C$_2$), $R^4$ is an aryl group having from 6 to 20 carbon atoms or an aralkyl group having from 7 to 20 carbon atoms. Examples of the aryl group of $R^4$ include the same aryl groups described for $R^2$, and the aryl group is preferably a phenyl group or naphthyl group. Examples of the aralkyl group of $R^4$ include the same aralkyl groups described for $R^2$.

In the formula, $R^5$ are the same or different, and are each an alkyl group having from 1 to 12 carbon atoms or a phenyl group. Examples of the alkyl group of $R^5$ include the same alkyl groups described for $R^2$, and the alkyl group is preferably a methyl group.

In the formula, $R^6$ are the same or different, and are each an alkyl group having from 1 to 12 carbons, examples of which include the same alkyl groups as described for $R^2$, and are preferably methyl groups.

In the formula, d, e, f, and g are numbers that satisfy such that 0.1≤d≤0.7, 0≤e≤0.5, 0≤f≤0.7, 0.1≤g<0.9, and d+e+f+g=1, and are preferably numbers that satisfy such that 0.2≤d≤0.7, 0≤e≤0.4, 0≤f<0.5, 0.25≤g<0.7, and d+e+f+g=1. This is because the gas permeability of the cured product is reduced if d is not less than the lower limit of the above-mentioned range and the cured product has an appropriate hardness if d is not more than the upper limit of the above-mentioned range. In addition, the refractive index of the cured product is improved if e is not more than the upper limit of the above-mentioned range. In addition, the cured product has an appropriate hardness and the reliability of an optical semiconductor device prepared using the present composition is improved if f is not more than the upper limit of the above-mentioned range. In addition, the refractive index of the cured product is increased if g is not less than the lower limit of the above-mentioned range and the mechanical strength of the cured product is improved if g is not more than the upper limit of the above-mentioned range.

The molecular weight of this type of component (C$_2$) is not particularly limited, but from the perspectives of the handling/workability of the composition and the mechanical strength of the cured product, the mass average molecular weight in terms of standard polystyrene, as measured by gel permeation chromatography, is preferably from 500 to 10,000, and more preferably from 500 to 2,000.

Examples of this type of component (C$_2$) include organopolysiloxanes such as those mentioned below. Moreover, Me, Ph, and Naph in the formulae below denote a methyl group, a phenyl group, and a naphthyl group respectively, and d, e', f', and g are numbers that satisfy such that 0.1≤d≤0.7, 0<e'≤0.5, 0<f'≤0.7, 0.1≤g<0.9, and d+e'+f'+g=1.

$(HMe_2SiO_{1/2})_d(PhSiO_{3/2})_g$ $(HMePhSiO_{1/2})_d(PhSiO_{3/2})_g$ $(HMePhSiO_{1/2})_d(NaphSiO_{3/2})_g$ $(HMe_2SiO_{1/2})_d(NaphSiO_{3/2})_g$ $(HMePhSiO_{1/2})_d(HMe_2SiO_{1/2})_e(PhSiO_{3/2})_g$ $(HMe_2SiO_{1/2})_d(Ph_2SiO_{2/2})_f(PhSiO_{3/2})_g$ $(HMePhSiO_{1/2})_d(Ph_2SiO_{2/2})_f(PhSiO_{3/2})_g$ $(HMe_2SiO_{1/2})_d(Ph_2SiO_{2/2})_f(NaphSiO_{3/2})_g$ $(HMePhSiO_{1/2})_d(Ph_2SiO_{2/2})_f(NaphSiO_{3/2})_g$ $(HMePhSiO_{1/2})_d(HMe_2SiO_{1/2})_e(NaphSiO_{3/2})_g$ $(HMePhSiO_{1/2})_d(HMe_2SiO_{1/2})_e(Ph_2SiO_{2/2})_f(NaphSiO_{3/2})_g$ $(HMePhSiO_{1/2})_d(HMe_2SiO_{1/2})_e(Ph_2SiO_{2/2})_f(PhSiO_{3/2})_g$ Component (C) can be component ($C_1$), component ($C_2$), or a mixture of components ($C_1$) and component ($C_2$). In cases where a mixture of components ($C_1$) and ($C_2$) is used, the mixing ratio is not particularly limited, but it is preferable for the ratio of mass of component ($C_1$):mass of component ($C_2$) to be from 0.5:9.5 to 9.5:0.5.

The content of component (C) in the present composition, per 1 mol of total alkenyl groups in components (A) and (B), is in a range such that the silicon-bonded hydrogen atoms in component (C) is in a range of 0.1 to 5 mol, and preferably in a range of 0.5 to 2 mol. This is because when the content of component (C) is greater than or equal to the lower limit of the range described above, the composition is cured sufficiently, and when the content is less than or equal to the upper limit of the range described above, the heat resistance of the cured product improves, thus making it possible to improve the reliability of an optical semiconductor device produced using this composition.

Component (D) is a hydrosilylation reaction catalyst for accelerating the curing of this composition, and examples include platinum-based catalysts, rhodium-based catalysts, and palladium-based catalysts. Particularly, component (D) is preferably a platinum-based catalyst so that the curing of the present composition can be dramatically accelerated. Examples of the platinum-based catalyst include a platinum fine powder, chloroplatinic acid, an alcohol solution of chloroplatinic acid, a platinum-alkenylsiloxane complex, a platinum-olefin complex and a platinum-carbonyl complex, with a platinum-alkenylsiloxane complex being preferred.

The content of component (D) in this composition is an effective amount for accelerating the curing of the composition. Specifically, in order to be able to sufficiently accelerate the curing reaction of this composition, the content of component (D) is preferably an amount so that the catalyst metal in component (D) is in the range of 0.01 to 500 ppm, more preferably in the range of 0.01 to 100 ppm, and particularly preferably in the range of 0.01 to 50 ppm in mass units with respect to this composition.

This composition may also contain an adhesion-imparting agent in order to improve the adhesiveness of the cured product with respect to the substrate with which the composition makes contact during the course of curing. Preferred adhesion-imparting agents are organosilicon compounds having at least one alkoxy group bonded to a silicon atom in a molecule. This alkoxy group is exemplified by a methoxy group, an ethoxy group, a propoxy group, a butoxy group, and a methoxyethoxy group; and the methoxy group is particularly preferred. Moreover, non-alkoxy groups bonded to a silicon atom of this organosilicon compound are exemplified by substituted or non-substituted monovalent hydrocarbon groups such as alkyl groups, alkenyl groups, aryl groups, aralkyl groups, halogenated alkyl groups and the like; epoxy group-containing monovalent organic groups such as glycidoxyalkyl groups (such as a 3-glycidoxypropyl group, a 4-glycidoxybutyl group, and the like), epoxycyclohexylalkyl groups (such as a 2-(3,4-epoxycyclohexyl)ethyl group, a 3-(3,4-epoxycyclohexyl)propyl group, and the like) and oxiranylalkyl groups (such as a 4-oxiranylbutyl group, an 8-oxiranyloctyl group, and the like); acrylic group-containing monovalent organic groups such as a 3-methacryloxypropyl group and the like; and a hydrogen atom. This organosilicon compound preferably has a silicon-bonded alkenyl group or silicon-bonded hydrogen atom. Moreover, due to the ability to impart good adhesion with respect to various types of substrates, this organosilicon compound preferably has at least one epoxy group-containing monovalent organic group in a molecule. This type of organosilicon compound is exemplified by organosilane compounds, organosiloxane oligomers and alkyl silicates. Molecular structure of the organosiloxane oligomer or alkyl silicate is exemplified by a linear structure, partially branched linear structure, branched chain structure, ring-shaped structure, and net-shaped structure. A linear chain structure, branched chain structure, and net-shaped structure are particularly preferred. This type of organosilicon compound is exemplified by silane compounds such as 3-glycidoxypropyltrimethoxysilane, 2-(3,4-epoxycyclohexyl)ethyltrimethoxysilane, 3-methacryloxypropyltrimethoxysilane, and the like; siloxane compounds having at least one of silicon-bonded alkenyl groups and silicon-bonded hydrogen atoms, and at least one silicon-bonded alkoxy group in a molecule; mixtures of a silane compound or siloxane compound having at least one silicon-bonded alkoxy group and a siloxane compound having at least one silicon-bonded hydroxyl group and at least one silicon-bonded alkenyl group in a molecule; and methyl polysilicate, ethyl polysilicate, and epoxy group-containing ethyl polysilicate. The content of the adhesion-imparting agent in the present composition is not particularly limited but is preferably in the range of 0.01 to 10 parts by mass with respect to a total of 100 parts by mass of components (A) to (D) described above so as to ensure favorable adhesion to the substrate with which the composition makes contact during the course of curing.

The present composition may contain an organohydrogenpolysiloxane other than component (C) as long as the objective of the present invention is not impaired. This type of organohydrogenpolysiloxane is exemplified by a methylhydrogenpolysiloxane capped at both molecular terminals with trimethylsiloxy groups, a copolymer of dimethylsiloxane and methylhydrogensiloxane capped at both molecular terminals with trimethylsiloxy groups, a copolymer of dimethylsiloxane, methylhydrogensiloxane, and methylphenylsiloxane capped at both molecular terminals with trimethylsiloxy groups, a dimethylpolysiloxane capped at both molecular terminals with dimethylhydrogensiloxy groups, a copolymer of dimethylsiloxane and methylphenylsiloxane capped at both molecular terminals with dimethylhydrogensiloxy groups, a methylphenylpolysiloxane capped at both molecular terminals with dimethylhydrogensiloxy groups, an organopolysiloxane copolymer composed of siloxane units represented by the general formula $R'_3SiO_{1/2}$, siloxane units represented by the general formula $R'_2HSiO_{1/2}$ and siloxane units represented by the formula $SiO_{4/2}$, an organopolysiloxane copolymer composed of siloxane units represented by the general formula $R'_2HSiO_{1/2}$ and siloxane units represented by the formula $SiO_{4/2}$, an organopolysiloxane copolymer composed of siloxane units represented by the general formula $R'HSiO_{2/2}$ and siloxane units represented by the general formula $R'SiO_{3/2}$ or siloxane units represented by the formula $HSiO_{3/2}$, and a mixtures of two or more such organopolysiloxanes. Moreover, R' is an alkyl group having from 1 to 12 carbons, an aryl group having from 6 to 20 carbons, an aralkyl group having from 7 to 20 carbons, or a halogenated alkyl group having from 1 to 12 carbons. Examples of the alkyl group of R' include methyl groups, ethyl groups, propyl groups, butyl groups, pentyl groups, hexyl groups, heptyl groups, octyl groups, nonyl groups, decyl groups, undecyl groups, and dodecyl groups. In addition, examples of the aryl group of R' include phenyl groups, tolyl groups, xylyl groups, naphthyl groups, anthracenyl groups, phenanthryl groups, pyrenyl groups, and groups obtained by substituting hydrogen atoms in these aryl groups with alkyl groups such as methyl groups or ethyl groups; alkoxy groups such as methoxy groups or ethoxy groups; and halogen atoms such as chlorine atoms or bromine atoms. In addition, examples of the aralkyl group of R include benzyl groups, phenethyl groups, naphthyl ethyl groups, naphthyl propyl groups, anthracenyl ethyl groups, phenanthryl ethyl groups, pyrenyl ethyl groups, and groups obtained by substituting hydrogen atoms in these aralkyl groups with alkyl groups such as methyl groups or ethyl groups; alkoxy groups such as methoxy groups or ethoxy groups; and halogen atoms such as chlorine atoms or bromine atoms. In addition, examples of the halogenated alkyl group of R' include chloromethyl groups and 3,3,3-trifluoropropyl groups.

A reaction inhibitor, for example, an alkyne alcohol such as 2-methyl-3-butyn-2-ol, 3,5-dimethyl-1-hexyn-3-ol and 2-phenyl-3-butyn-2-ol; an ene-yne compound such as 3-methyl-3-penten-1-yne and 3,5-dimethyl-3-hexen-1-yne; or 1,3,5,7-tetramethyl-1,3,5,7-tetravinylcyclotetrasiloxane, 1,3,5,7-tetramethyl-1,3,5,7-tetrahexenylcyclotetrasiloxane or a benzotriazole may be incorporated as an optional component in the present composition. The content of the reaction inhibitor in this composition is not particularly limited but is preferably in the range of 0.0001 to 5 parts by mass with respect to a total of 100 parts by mass of components (A) to (D) described above.

This composition may also contain a fluorescent substance as an optional component. This fluorescent substance is exemplified by substances widely used in light emitting diodes (LEDs), such as yellow, red, green, and blue light-emitting fluorescent substances such as oxide fluorescent substances, oxynitride fluorescent substances, nitride fluorescent substances, sulfide fluorescent substances, oxysulfide fluorescent substances, and the like. Examples of oxide fluorescent substances include yttrium, aluminum, and garnet-type YAG green to yellow light-emitting fluorescent substances containing cerium ions; terbium, aluminum, and garnet-type TAG yellow light-emitting fluorescent substances containing cerium ions; and silicate green to yellow light-emitting fluorescent substances containing cerium or europium ions. Examples of oxynitride fluorescent substances include silicon, aluminum, oxygen, and nitrogen-type SiAlON red to green light-emitting fluorescent substances containing europium ions. Examples of nitride fluorescent substances include calcium, strontium, aluminum, silicon, and nitrogen-type cousin red light-emitting fluorescent substances containing europium ions. Examples of sulfide fluorescent substances include ZnS green light-emitting fluorescent substances containing copper ions or aluminum ions. Examples of oxysulfide fluorescent substances include $Y_2O_2S$ red light-emitting fluorescent substances containing europium ions. These fluorescent substances may be used as one type or as a mixture of two or more types. The content of the fluorescent substance in this composition is not particularly limited but is preferably in the range of 0.1 to 70 mass % and more preferably in the range of 1 to 20 mass % in this composition.

Moreover, an inorganic filler such as silica, glass, alumina or zinc oxide; an organic resin fine powder of a polymethacrylate resin and the like; a heat-resistant agent, a dye, a pigment, a flame retardant, a solvent and the like may be incorporated as optional components in the present composition at levels that do not impair the objective of the present invention.

Of the components added as optional components, in order to sufficiently suppress the discoloration of the silver electrodes or the silver plating of the substrate in the optical semiconductor device due to sulfur-containing gas in the air, it is possible to add at least one type of a fine powder having an average particle size from 0.1 nm to 5 μm selected from a group comprising zinc oxide fine powders surface-coated with at least one type of oxide of an element selected from a group comprising Al, Ag, Cu, Fe, Sb, Si, Sn, Ti, Zr, and rare earth elements, zinc oxide fine powders surface-treated with organosilicon compounds not having alkenyl groups, and hydrate fine powders of zinc carbonate.

In a zinc oxide fine powder surface-coated with an oxide, examples of rare earth elements include yttrium, cerium, and europium. Examples of oxides on the surface of the zinc oxide powder include $Al_2O_3$, $AgO$, $Ag_2O$, $Ag_2O_3$, $CuO$, $Cu_2O$, $FeO$, $Fe_2O_3$, $Fe_3O_4$, $Sb_2O_3$, $SiO_2$, $SnO_2$, $Ti_2O_3$, $TiO_2$, $Ti_3O_5$, $ZrO_2$, $Y_2O_3$, $CeO_2$, $Eu_2O_3$, and mixtures of two or more types of these oxides.

In a zinc oxide powder surface-treated with an organosilicon compound, the organosilicon compound does not have alkenyl groups, and examples include organosilanes, organosilazanes, polymethylsiloxanes, organohydrogenpolysiloxanes, and organosiloxane oligomers. Specific examples include organochlorosilanes such as trimethylchlorosilane, dimethylchlorosilane, and methyltrichlorosilane; organotrialkoxysilanes such as methyltrimethoxysilane, methyltriethoxysilane, phenyltrimethoxysilane, ethyltrimethoxysilane, n-propyltrimethoxysilane, and γ-methacryloxypropyltrimethoxysilane; diorganodialkoxysilanes such as dimethyldimethoxysilane, dimethyldiethoxysilane, and diphenyldimethoxysilane; triorganoalkoxysilanes such as trimethylmethoxysilane and trimethylethoxysilane; partial condensates of these organoalkoxysilanes; organosilazanes such as hexamethyldisilazane; a polymethylsiloxane, an organohydrogenpolysiloxane, an organosiloxane oligomer having a silanol group or an alkoxy group, and a resin-like organopolysiloxanes consisting of an $R^9SiO_{3/2}$ unit (wherein $R^9$ is a monovalent hydrocarbon group excluding alkenyl groups, examples of which include alkyl groups such as methyl groups, ethyl groups, or propyl groups; and aryl groups such as phenyl groups) or an $SiO_{4/2}$ unit, and having a silanol group or an alkoxy group.

A hydrate fine powder of zinc carbonate is a compound in which water bonds to zinc carbonate, and a preferable compound is one in which the rate of weight decrease is at least 0.1 wt. % under heating conditions at 105° C. for 3 hours.

The content of the zinc oxide is an amount in a range from 1 ppm to 10% and preferably an amount in a range from 1 ppm to 5% of the composition in terms of mass units. This is because when the content of the component is greater than or equal to the lower limit of the range described above, the discoloration of the silver electrodes or the silver plating of the substrate in the optical semiconductor device due to a sulfur-containing gas is sufficiently suppressed, and when the content is less than or equal to the upper limit of the range described above, the fluidity of the resulting composition is not diminished.

In addition, the composition may also contain a triazole-based compound as an optional component to enable the further suppression of the discoloration of the silver electrodes or the silver plating of the substrate due to a sulfur-containing gas in the air. Examples of such components include 1H-1,2,3-triazole, 2H-1,2,3-triazole, 1H-1,2,4-triazole, 4H-1,2,4-triazole, 2-(2'-hydroxy-5'-methylphenyl)benzotriazole, 1H-1,2,3-triazole, 2H-1,2,3-triazole, 1H-1,2,4-triazole, 4H-1,2,4-triazole, benzotriazole, tolyltriazole, carboxybenzotriazole, 1H-benzotriazole-5-methylcarboxylate, 3-amino-1,2,4-triazole, 4-amino-1,2,4-triazole, 5-amino-1,2,4-triazole, 3-mercapto-1,2,4-triazole, chlorobenzotriazole, nitrobenzotriazole, aminobenzotriazole, cyclohexano[1,2-d]triazole, 4,5,6,7-tetrahydroxytolyltriazole, 1-hydroxybenzotriazole, ethylbenzotriazole, naphthotriazole, 1-N,N-bis(2-ethylhexyl)-[(1,2,4-triazole-1-yl)methyl]amine, 1-[N,N-bis(2-ethylhexyl)aminomethyl]benzotriazole, 1-[N,N-bis(2-ethylhexyl)aminomethyl]tolyltriazole, 1-[N,N-bis(2-ethylhexyl)aminomethyl]carboxybenzotriazole, 1-[N,N-bis(2-hydroxyethyl)-aminomethyl]benzotriazole, 1-[N,N-bis(2-hydroxyethyl)-aminomethyl]tolyltriazole, 1-[N,N-bis(2-hydroxyethyl)-aminomethyl]carboxybenzotriazole, 1-[N,N-bis(2-hydroxypropyl)aminomethyl]carboxybenzotriazole, 1-[N,N-bis(1-butyl)aminomethyl]carboxybenzotriazole, 1-[N,N-bis(1-octyl)aminomethyl]carboxybenzotriazole, 1-(2',3'-dihydroxypropyl)benzotriazole, 1-(2',3'-di-carboxyethyl)benzotriazole, 2-(2'-hydroxy-3',5'-di-tert-butylphenyl)benzotriazole, 2-(2'-hydroxy-3',5'-amylphenyl)benzotriazole, 2-(2'-hydroxy-4'-octoxyphenyl)benzotriazole, 2-(2'-hydroxy-5'-tert-butylphenyl)benzotriazole, 1-hydroxybenzotriazole-6-carboxylic acid, 1-oleoylbenzotriazole, 1,2,4-triazol-3-ol, 5-amino-3-mercapto-1,2,4-triazole, 5-amino-1,2,4-triazole-3-carboxylic acid, 1,2,4-triazole-3-carboxyamide, 4-aminourazole, and 1,2,4-triazol-5-one. The content of this benzotriazole compound is not particularly limited but is an amount in a range from 0.01 ppm to 3% and preferably in a range from 0.1 ppm to 1% of the composition in terms of mass units.

The present composition is such that curing occurs either at room temperature or under heating, but it is preferable to heat the composition in order to achieve rapid curing. The heating temperature is preferably from 50 to 200° C.

The cured product of the present invention will now be described in detail.

The cured product of the present invention is formed by curing the aforementioned curable silicone composition. The shape of the cured product is not particularly limited, and examples include a sheet shape and a film shape. The cured product can be handled as a simple substance or may also be handled in a state in which the cured product covers or seals an optical semiconductor element or the like.

The optical semiconductor device of the present invention will now be explained in detail.

The optical semiconductor device of the present invention is produced by sealing an optical semiconductor element with a cured product of the curable silicone composition described above. Examples of such an optical semiconductor device of the present invention include a light emitting diode (LED), a photocoupler, and a CCD. Examples of optical semiconductor elements include light emitting diode (LED) chips and solid-state image sensing devices.

FIG. 1 illustrates a cross-sectional view of a single surface mounted type LED, which is one example of the optical semiconductor device of the present invention. In the LED illustrated in FIG. 1, an LED chip 1 is die-bonded to a lead frame 2, and the LED chip 1 and a lead frame 3 are wire-bonded by a bonding wire 4. A casing material 5 is provided around this LED chip 1, and the LED chip 1 inside the casing material 5 is sealed by a cured product 6 of the curable silicone composition of the present invention.

An example of a method of producing the surface mounted type LED illustrated in FIG. 1 is a method of die-bonding the LED chip 1 to the lead frame 2, wire-bonding the LED chip 1 and the lead frame 3 with a gold bonding wire 4, filling the inside of the casing material 5 provided around the LED chip 1 with the curable silicone composition of the present invention, and then curing the composition by heating at 50 to 200° C.

EXAMPLES

The curable silicone composition, the cured product thereof, and the optical semiconductor device of the present invention will be described in detail hereinafter using Practical and Comparative Examples. In Practical and Comparative Examples, the viscosity is the value at 25° C., and Me, Vi, Ph, and Naph respectively represent a methyl group, a vinyl group, a phenyl group, and a naphthyl group. The characteristics of the cured product of the curable silicone composition were measured as follows.

[Refractive Index of the Cured Product]

A cured product is produced by heating the curable silicone composition at 150° C. for 2 hours in a circulating hot air oven. The refractive index of this cured product at 25° C. and a wavelength of 633 nm was measured using a refractometer.

[Water Vapor Permeability of the Cured Product]

A cured film with a thickness of 1 mm was prepared by curing the curable silicone composition for 2 hours at 150° C. using a press. The water vapor permeability of the cured film was measured in accordance with the cup method of JIS Z0208 under conditions with a temperature of 40° C. and 90% relative humidity.

Reference Example 1

First, 400 g (2.02 mol) of phenyltrimethoxysilane and 93.5 g (0.30 mol) of 1,3-divinyl-1,3-diphenyldimethyldisiloxane were loaded into a reaction vessel and mixed in advance. Next, 1.74 g (11.6 mmol) of trifluoromethane sulfonic acid was added, and 110 g (6.1 mol) of water was added and heat-refluxed for 2 hours while stirring. The mixture was then distilled at atmospheric pressure by heating until the mixture reached 85° C. Next, 89 g of toluene and 1.18 g (21.1 mmol) of potassium hydroxide were added, and after the mixture was distilled at atmospheric pressure by heating until the reaction temperature reached 120° C., the mixture was reacted for 6 hours at this temperature. The mixture was then cooled to room temperature, and a neutralization was performed by adding 0.68 g (11.4 mmol) of acetic acid. The produced salt was filtered, and low boiling point substances were removed from the obtained transparent solution by heating under reduced pressure, thereby producing 347 g (yield: 98%) of an organopolysiloxane resin represented by the average unit formula:

(MePhViSiO$_{1/2}$)$_{0.23}$(PhSiO$_{3/2}$)$_{0.77}$

Reference Example 2

First, 892.8 g (3.6 mol) of 1-naphthyltrimethoxysilane and 372.0 g (1.2 mol) of 1,3-divinyl-1,3-diphenyldimethyldisiloxane were loaded into a reaction vessel and mixed in advance. Next, 6.15 g (41 mmol) of trifluoromethane sulfonic acid was added, and 213.84 g (11.88 mol) of water was added and heat-refluxed for 2 hours while stirring. The mixture was then distilled at atmospheric pressure by heating until the mixture reached 85° C. Next, 435.6 g of toluene and 3.28 g (58.6 mmol) of potassium hydroxide were added, and after the mixture was distilled at atmospheric pressure by heating until the reaction temperature reached 120° C., the mixture was reacted for 6 hours at this temperature. The mixture was then cooled to room temperature, and a neutralization was performed by adding 3.524 g (58.7 mmol) of acetic acid. The produced salt was filtered, and low boiling point substances were removed from the obtained transparent solution by heating under reduced pressure, thereby producing 957.4 g (yield: 94.2%) of an organopolysiloxane resin represented by the average unit formula:

(MePhViSiO$_{1/2}$)$_{0.40}$(NaphSiO$_{3/2}$)$_{0.60}$

Reference Example 3

First, 50 g (201 mmol) of 1-naphthyltrimethoxysilane was loaded into a reaction vessel and was heated and melted. Thereafter, 0.06 g (0.4 mmol) of trifluoromethane sulfonic acid was added. While the system was heated to 45 to 50° C., 9.3 g (154.9 mmol) of acetic acid was added in a drop-wise manner. After completion of drop-wise addition, the mixture was heated and stirred for 30 minutes at 50° C. The mixture was heated and low boiling point substances were distilled at atmospheric pressure until the reaction temperature reached 80° C. Thereafter, the mixture was cooled down to room temperature. 24.4 g (181.6 mmol) of 1,1,3,3-tetramethyldisiloxane was added in a drop-wise manner, and the mixture was heated to reach a reaction temperature of 45° C. Thereafter, 18 g of acetic acid was added drop-wise at 45 to 50° C. After completion of drop-wise addition, the mixture was heated and stirred for 30 minutes at 50° C. While the system was maintained at a temperature of 60° C. or less by air or water cooling, 15.5 g (151.8 mmol) of acetic acid anhydride was added in a drop-wise manner. After completion of drop-wise addition, the mixture was heated and stirred for 30 minutes at 50° C. Thereafter, toluene and water were added, the mixture was stirred, and the mixture was allowed to sit. The water washing was performed while repeatedly removing the lower layer. After confirming that pH of the lower layer was 7, the upper layer (i.e. toluene layer) was heated and distilled under vacuum to remove low boiling point substances, thereby producing 43 g (yield: 76.0%) of organopolysiloxane in colorless transparent liquid form represented by the average unit formula:

(HMe$_2$SiO$_{1/2}$)$_{0.60}$(NaphSiO$_{3/2}$)$_{0.40}$

The mass average molecular weight (Mw) of this organopolysiloxane was 660, and the dispersity (Mw/Mn) was 1.05. The refractive index was 1.548.

Reference Example 4

100 g (0.233 moles) of a methylphenylpolysiloxane represented by the formula:

HO(MePhSiO)$_6$H, 100 g of toluene, and 25.6 g (0.350 moles) of diethylamine were placed in a reaction vessel, and 44.6 g (0.245 moles) of vinylmethylphenylchlorosilane was added while stirring. After the mixture was stirred for 1 hour at room temperature, the mixture was heated to 50° C. and stirred for 3 hours. Next, 0.38 g of methanol was added, and water was then added. After the mixture was washed with water, low-boiling-point substances were distilled out of the organic layer by heating under reduced pressure, thereby producing a colorless, clear organopolysiloxane (viscosity: 72.5 mPa·s, refractive index: 1.545) represented by the formula:

MePhViSiO(MePhSiO)$_6$SiMePhVi

Reference Example 5

100 g (0.233 moles) of a methylphenylpolysiloxane represented by the formula:

HO(MePhSiO)$_6$H, 100 g of toluene, and 29.7 g (0.294 moles) of triethylamine were placed in a reaction vessel, and 59.9 g (0.245 moles) of vinyldiphenylchlorosilane was added while stirring. After the mixture was stirred for 1 hour at room temperature, the mixture was heated to 50° C. and stirred for 3 hours. Next, 0.38 g of methanol was added, and water was then added. After the mixture was washed with water, low-boiling-point substances were distilled out of the organic layer by heating under reduced pressure, thereby producing a colorless, clear organopolysiloxane (viscosity: 447.5 mPa·s, refractive index: 1.567) represented by the formula:

Ph$_2$ViSiO(MePhSiO)$_6$SiPh$_2$Vi

Reference Example 6

114 g of a cyclic phenylmethylpolysiloxane, 166 g of a cyclic diphenylpolysiloxane, 20.0 g of methylphenylvinyldisiloxane, and 0.03 g of potassium hydroxide, were added to a reaction vessel and heated to 150° C. After the mixture reached 150° C., the mixture was aged for 5 hours. After the mixture was neutralized by adding acetic acid, the low-boiling-point substances were removed under reduced pressure, thereby producing a colorless, clear organopolysiloxane (viscosity: 40 Pa·s, refractive index: 1.585) represented by the formula:

MePhViSiO(MePhSiO)$_{13}$(Ph$_2$SiO)$_{13}$SiMePhVi

Reference Example 7

100 g (0.233 moles) of a methylphenylpolysiloxane represented by the formula:

HO(MePhSiO)$_6$H, 100 g of toluene, and 25.6 g (0.350 moles) of diethylamine were placed in a reaction vessel, and 30.9 g (0.256 moles) of vinyldimethylchlorosilane was added while stirring. After the mixture was stirred for 1 hour at room temperature, the mixture was heated to 50° C. and stirred for 3 hours. Next, 0.38 g of methanol was added, and water was then added. After the mixture was washed with water, low-boiling-point substances were distilled out of the organic layer by heating under reduced pressure, thereby producing a colorless, clear organopolysiloxane (viscosity: 39.8 mPa·s, refractive index: 1.520) represented by the formula:

$Me_2ViSiO(MePhSiO)_6SiMe_2Vi$

Reference Example 8

18.4 g of a cyclic diphenylsiloxane, 6.8 g of diphenylvinylsilanol, and 0.075 g of a 10% aqueous solution of potassium hydroxide were added to a reaction vessel, heated to 150° C., and stirred while heating for 5 hours. Next, after the mixture was neutralized by adding acetic acid, the low-boiling-point substances were removed under reduced pressure, thereby producing a white, solid organopolysiloxane represented by the formula:

$Ph_2ViSiO(Ph_2SiO)_6SiPh_2Vi$

Practical Example 1

56.7 parts by mass of the organopolysiloxane resin prepared in Reference Example 1, 20.0 parts by mass of the organopolysiloxane prepared in Reference Example 4, 23.3 parts by mass of an organotrisiloxane represented by the formula:

$HMe_2SiOPh_2SiOSiMe_2H$ (an amount at which the quantity of silicon-bonded hydrogen atoms in the component is 1 mole with respect to a total of 1 mole of the vinyl groups in the organopolysiloxane resin and the organopolysiloxane), and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1 mass % of platinum) were mixed, thereby producing a curable silicone composition having a viscosity of 0.78 Pa·s. The refractive index and water vapor permeability of a cured product of this curable silicone composition were evaluated. The results are shown in Table 1.

Practical Example 2

57.0 parts by mass of the organopolysiloxane resin prepared in Reference Example 1, 20.0 parts by mass of the organopolysiloxane prepared in Reference Example 5, 23.0 parts by mass of an organotrisiloxane represented by the formula:

$HMe_2SiOPh_2SiOSiMe_2H$ (an amount at which the quantity of silicon-bonded hydrogen atoms in the component is 1 mole with respect to a total of 1 mole of the vinyl groups in the organopolysiloxane resin and the organopolysiloxane), and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1 mass % of platinum) were mixed, thereby producing a curable silicone composition having a viscosity of 1.04 Pa·s. The refractive index and water vapor permeability of a cured product of this curable silicone composition were evaluated. The results are shown in Table 1.

Practical Example 3

60.1 parts by mass of the organopolysiloxane resin prepared in Reference Example 1, 20.0 parts by mass of the organopolysiloxane prepared in Reference Example 6, 19.9 parts by mass of an organotrisiloxane represented by the formula:

$HMe_2SiOPh_2SiOSiMe_2H$ (an amount at which the quantity of silicon-bonded hydrogen atoms in the component is 1 mole with respect to a total of 1 mole of the vinyl groups in the organopolysiloxane resin and the organopolysiloxane), and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1 mass % of platinum) were mixed, thereby producing a curable silicone composition having a viscosity of 5.69 Pa·s. The refractive index and water vapor permeability of a cured product of this curable silicone composition were evaluated. The results are shown in Table 1.

Practical Example 4

42.0 parts by mass of an organopolysiloxane resin represented by the average unit formula:

$(Me_2ViSiO_{1/2})_{0.25}(PhSiO_{3/2})_{0.75}$, 20.0 parts by mass of the organopolysiloxane prepared in Reference Example 5, 38.0 parts by mass of an organotrisiloxane represented by the formula:

$HMe_2SiO(Ph_2SiO)_{2.5}SiMe_2H$ (an amount at which the quantity of silicon-bonded hydrogen atoms in the component is 1 mole with respect to a total of 1 mole of the vinyl groups in the organopolysiloxane resin and the organopolysiloxane), and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1 mass % of platinum) were mixed, thereby producing a curable silicone composition having a viscosity of 2.38 Pa·s. The refractive index and water vapor permeability of a cured product of this curable silicone composition were evaluated. The results are shown in Table 1.

Practical Example 5

57.8 parts by mass of an organopolysiloxane resin represented by the average unit formula:

$(Me_2ViSiO_{1/2})_{0.25}(PhSiO_{3/2})_{0.75}$, 20.0 parts by mass of the organopolysiloxane prepared in Reference Example 6, 22.2 parts by mass of an organotrisiloxane represented by the formula:

$HMe_2SiOPh_2SiOSiMe_2H$ (an amount at which the quantity of silicon-bonded hydrogen atoms in the component is 1 mole with respect to a total of 1 mole of the vinyl groups in the organopolysiloxane resin and the organopolysiloxane), and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1 mass % of platinum) were mixed, thereby producing a curable silicone composition having a viscosity of 3.46 Pa·s. The refractive index and water vapor permeability of a cured product of this curable silicone composition were evaluated. The results are shown in Table 1.

Comparative Example 1

56.0 parts by mass of the organopolysiloxane resin prepared in Reference Example 1, 20.0 parts by mass of the organopolysiloxane prepared in Reference Example 7, 22.2 parts by mass of an organotrisiloxane represented by the formula:

$$HMe_2SiOPh_2SiOSiMe_2H$$

(an amount at which the quantity of silicon-bonded hydrogen atoms in the component is 1 mole with respect to a total of 1 mole of the vinyl groups in the organopolysiloxane resin and the organopolysiloxane), and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1 mass % of platinum) were mixed, thereby producing a curable silicone composition having a viscosity of 0.59 Pa·s. The refractive index and water vapor permeability of a cured product of this curable silicone composition were evaluated. The results are shown in Table 1.

Comparative Example 2

41.0 parts by mass of an organopolysiloxane represented by the average unit formula:

$$(Me_2ViSiO_{1/2})_{0.25}(PhSiO_{3/2})_{0.75},$$

20.0 parts by mass of the organopolysiloxane prepared in Reference Example 7, 39.0 parts by mass of an organotrisiloxane represented by the formula:

$$HMe_2SiO(Ph_2SiO)_{2.5}SiMe_2H$$

(an amount at which the quantity of silicon-bonded hydrogen atoms in the component is 1 mole with respect to a total of 1 mole of the vinyl groups in the organopolysiloxane resin and the organopolysiloxane), and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1 mass % of platinum) were mixed, thereby producing a curable silicone composition having a viscosity of 0.99 Pa·s. The refractive index and water vapor permeability of this curable silicone composition were evaluated. The results are shown in Table 1.

TABLE 1

| Item | Category Present invention | | | | |
|---|---|---|---|---|---|
| | Practical Example 1 | Practical Example 2 | Practical Example 3 | Practical Example 4 | Practical Example 5 |
| Refractive index | 1.561 | 1.568 | 1.571 | 1.565 | 1.557 |
| Water vapor permeability (g/m² · 24 h) | 9.3 | 7.3 | 6.3 | 9.4 | 9.5 |
| Appearance | Transparent | Transparent | Transparent | Transparent | Transparent |

| Item | Category Comparative Examples | |
|---|---|---|
| | Comparative Example 1 | Comparative Example 2 |
| Refractive index | 1.558 | 1.556 |
| Water vapor permeability (g/m² · 24 h) | 11.0 | 12.2 |
| Appearance | Transparent | Transparent |

Practical Example 6

52.0 parts by mass of the organopolysiloxane resin prepared in Reference Example 2, 20.0 parts by mass of the organopolysiloxane prepared in Reference Example 5, 14.0 parts by mass of an organotrisiloxane represented by the formula:

$$HMe_2SiOPh_2SiOSiMe_2H,$$

14.0 parts by mass of the organopolysiloxane prepared in Reference Example 3 (an amount at which the quantity of silicon-bonded hydrogen atoms in the organotrisiloxane and the component is 1 mole with respect to a total of 1 mole of the vinyl groups in the organopolysiloxane resin and the organopolysiloxane), and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1 mass % of platinum) were mixed, thereby producing a curable silicone composition having a viscosity of 5.98 Pa·s. The refractive index and water vapor permeability of a cured product of this curable silicone composition were evaluated. The results are shown in Table 2.

Practical Example 7

52.0 parts by mass of the organopolysiloxane resin prepared in Reference Example 2, 20.0 parts by mass of the organopolysiloxane prepared in Reference Example 4, 14.0 parts by mass of an organotrisiloxane represented by the formula:

$$HMe_2SiOPh_2SiOSiMe_2H,$$

14.0 parts by mass of the organopolysiloxane prepared in Reference Example 3 (an amount at which the quantity of silicon-bonded hydrogen atoms in the organotrisiloxane and the component is 1 mole with respect to a total of 1 mole of the vinyl groups in the organopolysiloxane resin and the organopolysiloxane), and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1 mass % of platinum) were mixed, thereby producing a curable silicone composition having a viscosity of 3.61 Pa·s. The refractive index and water vapor permeability of a cured product of this curable silicone composition were evaluated. The results are shown in Table 2.

Comparative Example 3

51.0 parts by mass of the organopolysiloxane resin prepared in Reference Example 2, 20.0 parts by mass of an organopolysiloxane represented by the formula:

$$ViMe_2SiO(MePhSiO)_6SiMe_2Vi,$$

14.5 parts by mass of an organotrisiloxane represented by the formula:

$$HMe_2SiOPh_2SiOSiMe_2H,$$

14.5 parts by mass of the organopolysiloxane prepared in Reference Example 3 (an amount at which the quantity of silicon-bonded hydrogen atoms in the organotrisiloxane and the component is 1 mole with respect to a total of 1 mole of the vinyl groups in the organopolysiloxane resin and the organopolysiloxane), and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1 mass % of platinum) were mixed, thereby producing a curable silicone composition having a viscosity of 2.69 Pa·s. The refractive index and water vapor permeability of a cured product of this curable silicone composition were evaluated. The results are shown in Table 2.

TABLE 2

| Item | Present invention | | Comparative Examples |
|---|---|---|---|
| | Practical Example 6 | Practical Example 7 | Comparative Example 3 |
| Refractive index | 1.600 | 1.594 | 1.586 |
| Water vapor permeability (g/m² · 24 h) | 3.1 | 4.2 | 4.5 |
| Appearance | Transparent | Transparent | Transparent |

It was confirmed that the curable silicone composition of Practical Examples 6 and 7 had higher refractive indices and a lower gas permeability of the cured product than that of Comparative Example 3.

INDUSTRIAL APPLICABILITY

The curable silicone composition of the present invention can be used as an adhesive, a potting agent, a protective agent, a coating agent, or an underfill agent for electrical/electronic use. In particular, the curable silicone composition has high reactivity and can form a cured product with low gas permeability, so the composition is suitable as a sealing agent or a protective coating material for an optical semiconductor element in an optical semiconductor device such as a light emitting diode (LED).

DESCRIPTION OF SYMBOLS

1 Optical semiconductor element
2 Lead frame
3 Lead frame
4 Bonding wire
5 Casing material
6 Cured product of curable silicone composition

The invention claimed is:

1. A curable silicone composition comprising:
(A) 100 parts by mass of an organopolysiloxane resin having at least two alkenyl groups in a molecule and represented by the average unit formula:

$(R^1R^2{}_2SiO_{1/2})_a(R^3{}_2SiO_{2/2})_b(R^4SiO_{3/2})_c$ wherein $R^1$ is an alkenyl group having from 2 to 12 carbons; $R^2$ are the same or different, and are each an alkyl group having from 1 to 12 carbons, an alkenyl group having from 2 to 12 carbons, an aryl group having from 6 to 20 carbons, or an aralkyl group having from 7 to 20 carbons; $R^3$ are the same or different, and are each an alkyl group having from 1 to 12 carbons, an alkenyl group having from 2 to 12 carbons, or a phenyl group; $R^4$ is an aryl group having from 6 to 20 carbons or an aralkyl group having from 7 to 20 carbons; and a, b, and c are numbers that satisfy such that $0.01 \le a \le 0.5$, $0 \le b \le 0.7$, $0.1 \le c < 0.9$, and $a+b+c=1$;

(B) from 5 to 150 parts by mass of an organopolysiloxane represented by the general formula:

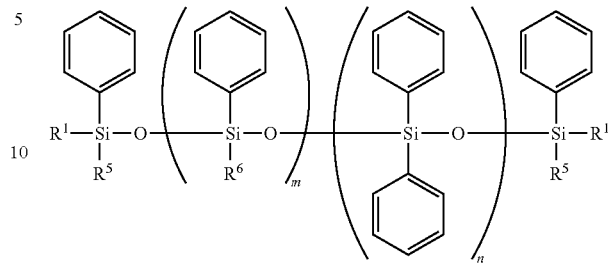

wherein $R^1$ is as defined above; $R^5$ are the same or different, and are each an alkyl group having from 1 to 12 carbon atoms or a phenyl group; $R^6$ is an alkyl group having from 1 to 12 carbon atoms; and m is an integer from 1 to 100, n is an integer from 0 to 50, where m≥n and 1≤m+n≤100;

(C) is an organosiloxane ($C_1$) represented by the general formula:

HMe₂SiOPh₂SiOSiMe₂H; or

HMe₂SiO(Ph₂SiO)₂.₅SiMe₂H;

wherein Me represents a methyl group and Ph represents a phenyl group; or (C) is a mixture of the organosiloxane ($C_1$) and an organopolysiloxane ($C_2$) having at least two silicon-bonded hydrogen atoms in a molecule and represented by the average unit formula:

$(HR^5R^6SiO_{1/2})_d(HR^6{}_2SiO_{1/2})_e(R^5{}_2SiO_{2/2})_f(R^4SiO_{3/2})_g$ wherein $R^4$, $R^5$, and $R^6$ are as defined above; and d, e, f, and g are numbers that satisfy such that $0.01 \le d \le 0.7$, $0 \le e \le 0.5$, $0 \le f \le 0.7$, $0.1 \le g < 0.9$, and $d+e+f+g=1$;

wherein component (C) is present in the silicone composition in an amount such that the number of silicon-bonded hydrogen atoms in component (C) is from 0.1 to 5 moles per 1 mol of total alkenyl groups in components (A) and (B); and (D) an effective amount of a hydrosilylation reaction catalyst.

2. The curable silicone composition according to claim 1, wherein $R^2$ in component (A) is a phenyl group or a naphthyl group.

3. The curable silicone composition according to claim 1, wherein $R^4$ in component (A) is a phenyl group or a naphthyl group.

4. The curable silicone composition according to claim 1, wherein $R^4$ in component ($C_2$) is a phenyl group or a naphthyl group.

5. The curable silicone composition according to claim 1, wherein in the mixture of components ($C_1$) and ($C_2$), a mass ratio of component ($C_1$) to component ($C_2$) is from 0.5:9.5 to 9.5:0.5.

6. A cured product produced by curing the curable silicone composition according to claim 1.

7. An optical semiconductor device comprising an optical semiconductor element sealed by a cured product of the curable silicone composition according to claim 1.

8. The curable silicone composition according to claim 2, wherein $R^4$ in component (A) is a phenyl group or a naphthyl group.

9. The curable silicone composition according to claim 2, wherein $R^4$ in component ($C_2$) is a phenyl group or a naphthyl group.

10. The curable silicone composition according to claim 3, wherein $R^4$ in component ($C_2$) is a phenyl group or a naphthyl group.

11. The curable silicone composition according to claim 2, wherein in the mixture of components ($C_1$) and ($C_2$), a mass ratio of component ($C_1$) to component ($C_2$) is from 0.5:9.5 to 9.5:0.5.

12. The curable silicone composition according to claim 3, wherein in the mixture of components ($C_1$) and ($C_2$), a mass ratio of component ($C_1$) to component ($C_2$) is from 0.5:9.5 to 9.5:0.5.

13. The curable silicone composition according to claim 4, wherein in the mixture of components ($C_1$) and ($C_2$), a mass ratio of component ($C_1$) to component ($C_2$) is from 0.5:9.5 to 9.5:0.5.

14. The curable silicone composition according to claim 1, wherein $0.05 \leq a \leq 0.4$, $0 \leq b \leq 0.4$, $0.45 \leq c < 0.8$, and $a+b+c=1$.

15. The curable silicone composition according to claim 1, wherein m is an integer from 1 to 75 and n is an integer from 0 to 25, where $m \geq n$ and $1 \leq m+n \leq 75$.

16. The curable silicone composition according to claim 1, wherein m is an integer from 1 to 50 and n is an integer from 0 to 25, where $m \geq n$ and $1 \leq m+n \leq 50$.

17. The curable silicone composition according to claim 1, wherein p is an integer from 0 to 10.

18. The curable silicone composition according to claim 1, wherein $0.2 \leq d \leq 0.7$, $0 \leq e \leq 0.4$, $0 \leq f < 0.5$, $0.25 \leq g < 0.7$, and $d+e+f+g=1$.

19. The curable silicone composition according to claim 17, wherein $0.2 \leq d \leq 0.7$, $0 \leq e \leq 0.4$, $0 \leq f < 0.5$, $0.25 \leq g < 0.7$, and $d+e+f+g=1$.

20. The curable silicone composition according to claim 1, wherein component $C_2$ has a mass average molecular weight in terms of standard polystyrene, as measured by gel permeation chromatography, from 500 to 10,000.

* * * * *